Jan. 6, 1970 S. N. SMILOWITZ 3,488,604

AUTOMATIC PULSED-SIGNAL AMPLITUDE NORMALIZER

Filed Sept. 1, 1967

INVENTOR.
S. N. SMILOWITZ

BY

[signature]

United States Patent Office 3,488,604
Patented Jan. 6, 1970

3,488,604
AUTOMATIC PULSED-SIGNAL AMPLITUDE NORMALIZER

Sidney N. Smilowitz, Flushing, N.Y., assignor to Sperry Rand Corporation, Ford Instrument Company Division, Long Island City, N.Y., a corporation of Delaware Filed Sept. 1, 1967, Ser. No. 665,138
Int. Cl. H03g 3/30
U.S. Cl. 330—29 10 Claims

ABSTRACT OF THE DISCLOSURE

An amplitude normalizer for compressing the range of signals without distorting their waveforms, including delay apparatus for applying two replicas of an input signal to a variable gain amplifier in a predetermined time sequence. The first replica is passed through the amplifier into a feedback circuit wherein it is full-wave rectified and compared to a reference signal to develop a control current proportional to the difference between the replica and a predetermined reference voltage. The control current is generated when the rectified signal exceeds the reference. The control is fed back to a capacitive storage device, current developing a gain control signal such as to continually decrease the gain of the amplifier until the peak of the output bears a fixed relationship wilth the reference voltage, with the final value of the gain control signal being stored by the storage device. Subsequently, the second replica of the input signal in being applied to the amplifier, is attenuated in accordance with the gain set during the previous run of the first replica.

This invention relates to amplitude normalizers and more particularly to an amplitude normalizer which is capable of compressing a wide dynamic range of electrical transient signal levels without distorting their waveforms.

Amplitude normalizers find many uses in the art. An amplitude normalizer, that is a device capable of compressing an electrical signal, is particularly useful when the input signal of concern may have a greater amplitude range than the electrical apparatus to which the signal may be applied. This invention finds application in such devices as radar, sonar and electronic countermeasure equipment for the processing of pulsed signals having a wide dynamic range of amplitudes. The information extracted, and in particular spectral frequency information, requires that the signal waveform not be distorted.

Prior art methods of achieving normalization of transient signals are based on sampling the peak amplitude of an input signal at discrete levels and selecting one of several channels to provide discrete levels of attenuation or gain. Such peak sampling methods of normalization have many disadvantages, only two of which are the requirement for a plurality of channels which materially complicate circuitry to increase costs and the reduction in overall reliability due to the extensive quantity of equipment required.

In contradistinction, the instant invention provides a continuous amplitude normalizer which requires but a single channel. Furthermore, the instant invention is based on an application of electronic feedback and consequently is inherently capable of higher accuracy than the peak sampling methods of the prior art, since feedback allows wide variations in many of the component parts of the system without corresponding degradation in its overall characteristics.

In its preferred embodiment, the amplitude normalizer of the instant invention includes a variable gain amplifier to the input of which is applied, in a predetermined time sequence, first and second replicas of the input signal to be normalized. The first replica of the input signal is passed through the amplifier and its output is rectified and the rectified waveform is compared in a feedback circuit to a predetermined DC voltage signal, with the difference there between generating a control current which is fed back to charge a storage capacitor, whose voltage (gain control signal) decreases the gain of the amplifier. Finally, when the peak of the output of the amplifier does not exceed the DC reference signal, the final value of the gain control signal is stored on a capacitor such that when the second replica of the input signal is applied to the input of the amplifier it will be normalized thereby in accordance with the gain which was previously set during the application of the first replica.

As a particularly advantageous feature of the instant invention, various gates are provided which control the sequence of operation of the normalizer while at the same time reduce noise and prime the normalizer for the reception of the next input signal. Thus a first gate is provided to couple the gain control current developed by the comparison of the rectified output waveform of the amplifier with the DC reference voltage back to the storage capacitor to set the gain of the amplifier. Such gate is operated simultaneously with, and for the same period as another gate in the delaying means of the instant invention which passes the first replica of the input signal on to the amplifier. In this manner the feedback circuit is completed only when the first replica of the input signal is being passed through the normalizer.

Upon the completion of the gain-setting portion of the normalization cycle, a second gate in the delay means of the instant invention is operated to permit the application of the second replica of the input signal to the input of the amplifier. At a slightly later period of time, and for approximately the same period thereof, another gate at the output of the normalizer is activated such that the second replica of the input signal may be passed through the amplifier, normalized by means of the gain previously established, and passed on to the desired external apparatus.

Additionally, yet another gate, normally conducting, is provided in electrical parallel with the capacitor storage element. The gate becomes non-conducting for the entire duration of the normalization process to permit the storage capacitor to be charged to the appropriate gain control signal level during passage of the first replica of the input signal and to remain at that level for passage of the second replica of the input signal. However, when the normalized signal is finally passed on to external apparatus, the gate is enabled to permit discharge of the capacitor.

Accordingly, it is an object of the instant invention to provide an amplitude normalizer which is capable of compressing a wide dynamic range of electrical transient signal levels without distortion of their waveforms.

Another object of the instant invention is to provide an amplitude normalizer which provides a continuous range of gain adjustment over its operation and requires but a single channel.

It is another object of the instant invention to provide such an amplitude normalizer which functions in a feedback mode of operation thereby assuring accuracy despite temperature variations and aging of the individual components thereof.

Yet another object of the instant invention is to provide such an amplitude normalizer which includes a variable gain amplifier, the gain of which is utilized to normalize an input signal with such gain being preset in accordance with a continuous comparison of a DC reference signal and the rectified output waveform of such amplifier, when it has the first replica of the input signal presented thereto.

Still another object of the instant invention is to provide such amplitude normalizer which includes a relatively simple storage element, such as a capacitor, to store the final value of the gain control signal which maintains the amplifier gain thus set for a subsequently applied replica of the input signal to effectuate normalization thereof.

These and other objects of the instant invention may be had by referring to the following description and drawings, in which.

Figures 1, 2, 3:
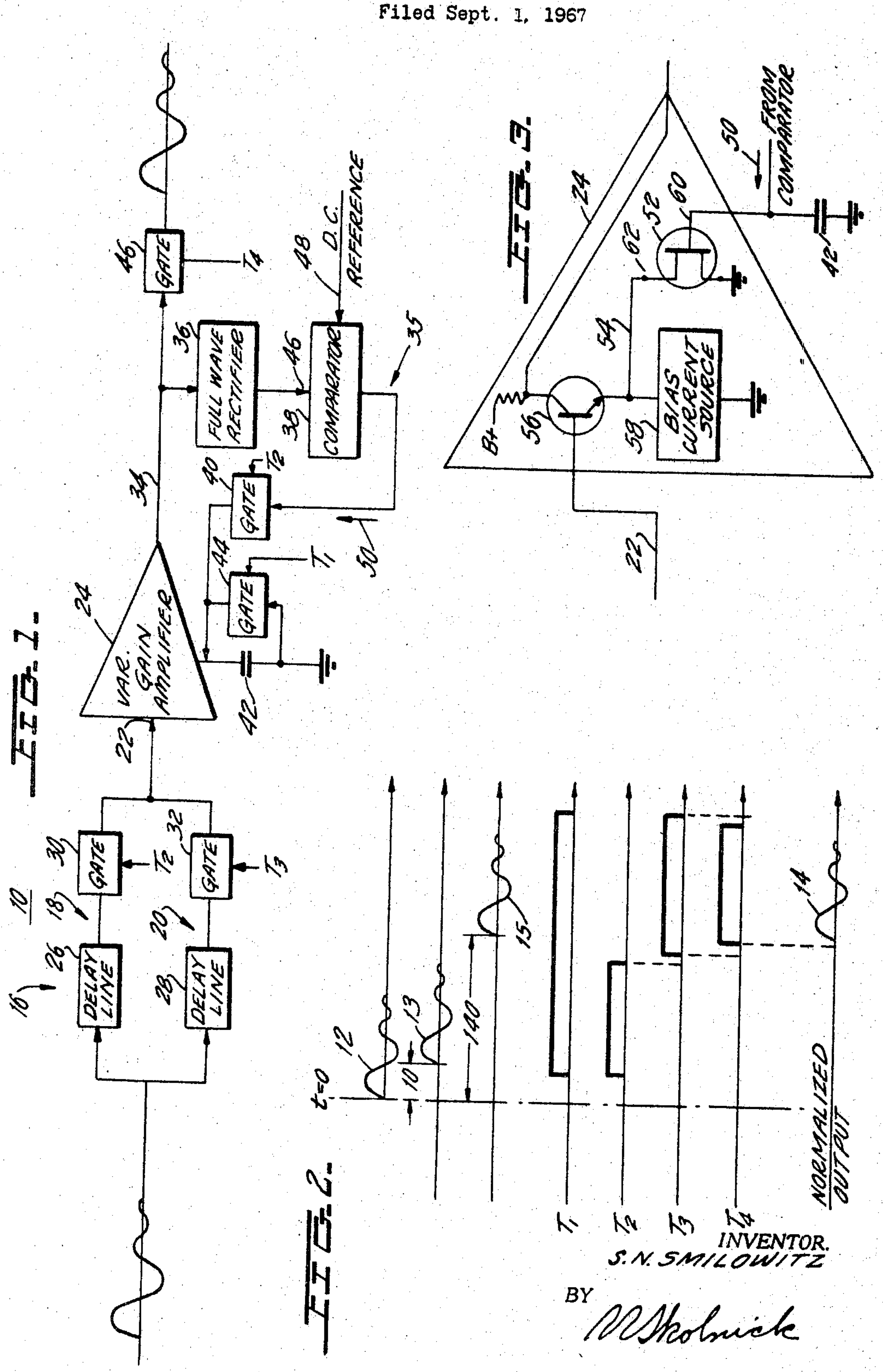
FIGURE 1 is a schematic block diagram of the amplitude normalizer of the instant invention.
FIGURE 2 is a series of time charts illustrating the sequential operation of the amplitude normalizer of FIGURE 1.
FIGURE 3 is a simplified schematic diagram of a variable gain amplifier which may be utilized in the amplitude normalizer of the instant invention.

Referring specifically to FIGURE 1, the amplitude normalizer 10 of the instant invention is useful to normalize a pulsed-input signal, schematically shown at 12, such that at the output, signal 14 will be produced which is of identical waveform to the input signal 12 but of an amplitude which tends to be uniform but which may vary within a small range. To this end the normalizer 10 includes, what may be designated, delay means 16, comprising parallel paths 18 and 20 for applying the signal 12 to the input 22 of a variable gain amplifier 24.

Each parallel path 18 and 20 of the delay means 16 includes a delay line 26 and 28, respectively, and normally non-conducting gates 30 and 32, respectively. For reasons to be further explained, the purpose of the delay means 16 is to present first and second replicas of the input signal 12 to the input 22 of the variable gain amplifier 24 at a predetermined time sequence relative to one another (see replicas 13 and 15 of FIGURE 2).

Thus, and for reasons to become apparent, in a preferred embodiment of the instant invention (illustrated in FIGURE 2) the delay line 26 is so designed as to introduce a delay of approximately 10 microseconds between the input signal 12 and the application of the replica 13 thereof to the input 22 of the amplifier 24. This delay is dependent on the manner in which the timing cycle is initiated. Its purpose is to permit the setting of appropriate gates before the signal is applied to them. Similarly, in a preferred embodiment the delay line 28 is so designed as to introduce a delay of 140 microseconds between the input signal 12 and the time at which the replica 15 thereof is applied to the input 22 of the amplifier 24.

Connected to the output 34 of the amplifier 24 is a feedback circuit 35 including a full wave rectifier 36, a comparator 38 and a gate 40, normally non-conducting, which when conducting passes the output of the comparator back to the variable gain amplifier to vary the gain thereof in a manner to be further described. In parallel with the feedback circuit is a storage element, preferably shown as a capacitor 42, which is utilized, as will be further explained, to store the value of the gain control signal which is developed by the control current passing through gate 40 to charge the capacitor 42. In parallel with the capacitor 42 is a gate 44 which, as will be further explained, is utilized to discharge the capacitor after a normalization sequence has taken place. Finally, a gate 46 is provided to pass the normalized signal 14 to external apparatus, not shown.

Each of the component elements of FIGURE 1 are presently within the state-of-the-art, are well known, and individually form no part of the instant invention. Various embodiments for each of the functions performed are possible. For example, variable gain amplifiers have been constructed using multi-element tubes and broadcast compressors, and more recently using solid-state devices such as transistors, diodes and relatively new field effect transistors. Full wave rectifiers are well known in the art and could be implemented, for example, by the use of semiconductor diodes. Similarly, the comparator 38 may be a relatively simple resistive adder network, and the various gates shown in FIGURE 1 might comprise simple semi-conductor controlled rectifiers turned on by the application of a suitable biasing signal applied thereto, or alternatively might comprise more sophisticated fast-acting gates comprising transistors combined with field effect transistors. The delay lines 26 and 28 may be conventional L-C circuits or indeed any other means for introducing a predetermined delay in a signal without distortion therethrough. A particularly advantageous variable gain amplifier has been found to be one that includes a field effect transistor included in the emitter circuit of a cooperating transistor. This preferred embodiment of the variable gain amplifier 24 will be presented and described with respect to FIGURE 3.

A better understanding of the nature of the amplitude normalizer of FIGURE 1 may best be understood by referring to the following description of a complete cycle of operation thereof.

The input signal 12 is applied to the delay means 16 such that first and second replicas 13 and 15 of the signal 12 are the outputs of the delay lines 26 and 28, respectively. As noted previously, delay line 26 introduces a very slight delay to the input 12, resulting in replica 13 whereas delay line 28 introduces a greater delay resulting in replica 15. Gate 30 is made conductive by the application of enabling signal $T_2$ (see FIGURE 2) such that the first replica 13 of the input signal is applied to the input 22 of the variable gain amplifier 24 to initiate the first step in the two-step normalization process as follows. With gate 46 in its non-conducting state (see $T_4$ in FIGURE 2), the output of the amplifier 24 is rectified at 36 and forms the first input 46 to the comparator 38. The second input to the comparator is a DC reference voltage 48. Assuming that the signal applied at 46 is greater than the DC reference voltage 48 (otherwise it is not within the range of normalization) a control current 50 is generated which is proportional to the difference between these signals. Since gate 40 is conducting (by the application of enabling signal $T_2$), this control current 50 is passed on to charge the capacitor 42 and the gain control voltage developed across the capacitor reduces the gain of the amplifier 24. It may be pointed out that gate 44 becomes non-conducting by the application of the timing signal $T_1$ for the entire duration of the normalizing process, see FIGURE 2.

Feedback operation continues to reduce the gain of the amplifier 24 until the control current 50 is reduced to zero, indicating the peak amplitude of the output signal appearing at 34 is equal to or less than the DC reference 48. However, it will be appreciated that even as the control current 50 is approaching zero, the capacitor 42 is being charged to its final gain control voltage for retaining the value of the gain of the amplifier 24.

After the gain is set, the gate 40 is turned off (by removing $T_2$) such that noise in the feedback circuit 35 cannot affect the capacitor 42, and the second replica 15 of the input signal 12, which has been delayed by the delay line 28, is passed through the gate 32, now conducting by the application of the enabling signal $T_3$, to the input of the amplifier 24. Shortly thereafter gate 46 is turned on by the application of the signal $T_4$. This begins the second step of the normalization process. The second replica of the input signal is then passed through the amplifier 24, amplified in accordance with the gain set during the previous application of the first replica of the input signal, and the normalized output signal 14 passed on to external apparatus through gate 46.

Finally, after the complete normalization cycle, the signal $T_1$ is removed from the gate 44 such that it reverts to its normally conducting condition to provide a shunt circuit for the capacitor 44 to discharge the previously stored gain control signal and await the initiation of the normalization of a subsequent input signal. It may now be appreciated that the short delay introduced by delay line 26 is provided to enable gates 32 and 40, and disable gate 44 before the signal is applied to variable gain amplifier 24.

Referring to FIGURE 3, there is shown in simplified schematic form preferred apparatus for varying the gain of the amplifier 24 in response to the control current signal 50 developed at the output of the comparator 38. Thus a field effect transistor 52 is located in the emitter circuit 54 of transistor 56 suitably biased by a current source 58. As well known in the art, a field effect transistor such as 52 is in effect a variable resistance, the resistance of which increases with increasing reverse biasing voltage on the gate 60 thereof. Furthermore, as the resistance from point 62 to ground increases, the gain of the transistor 56 decreases.

Accordingly, during the gain determinative step of the instant invention, as the output of the amplifier 24 approaches the amplitude of the DC reference signal 48, of FIGURE 1, the magnitude of the control current 50 decreases but continually charges capacitor 42 which, in turn, will make the base 60 of the field effect transistor 52 more negative to increase the resistance from terminal 62 to ground which, in turn, will decrease the gain of the amplifier 24. Finally, with the gain of the amplifier continually decreasing until the peak amplitude of its output at 34 equals the DC reference voltage 38 such that the control current signal 50 becomes zero. Capacitor 42 stores the final value of the gain control signal such that the oncoming second replica of the input signal will be normalized as it passes through the amplifier 24.

Thus there has been described a relatively simple amplitude normalizer which makes possible normalization of pulsed waveforms in a single channel, feedback mode of operation. Although there has been described a preferred embodiment of this novel invention, many variations and modifications will now be apparent to those skilled in the art.

The embodiments of the invention in which an exclusive privilege or property is claimed are defined as follows:

1. An amplitude normalizer comprising:

variable gain amplifying means for producing an output signal proportional to the amplitude of a signal applied to the input thereof;

comparator means responsive to said output signal and a predetermined reference signal for impressing a gain control signal on said amplifying means which is representative of the difference between said reference signal and said output signal, the gain of said amplifying means being varied by said gain control signal until said output signal equals said reference voltage;

storage means responsive to said gain control signal for storing the value thereof; and delays means responsive to an input signal for applying first and second replicas of said input signal to the input of said amplifying means in a predetermined sequence;

whereby the first of said replicas is utilized to set the gain of said amplifying means in accordance with the final value of said gain control signal stored by said storage means, and the second of said replicas will be amplified by said amplifying means in accordance with the final value of said gain.

2. The amplitude normalizer of claim 1, and further including:

first gate means interposed between said comparator means and said amplifying means for passing said gain control signal to said amplifying means only when said first replica of said input signal is being applied to the input of said amplifying means.

3. The amplitude normalizer of claim 2, and further including:

second gate means connected to the output of said amplifying means for passing the output of said amplifying means to external apparatus only when said second replica of said input signal is applied to the input of said amplifying means.

4. The amplitude normalizer of claim 2, wherein said reference voltage is DC, and further including:

rectifying means interposed between the output of said amplifying means and said comparator means for converting alternating current to direct current.

5. The amplitude normalizer of claim 4, wherein said storage means is a capacitor which is charged in response to said gain control signal.

6. The amplitude normalizer of claim 5, and further including:

third gate means connected in parallel with said capacitor for discharging said capacitor after said second replica of said input signal has passed through said amplifying means.

7. The amplitude normalizer of claim 3, wherein said delay means includes first and second parallel paths, both of which are responsive at one end to said input signal and connected at the other end to the input of said amplifying means; said first path including a delay element for introducing a first predetermined period of delay in said first replica relative to said input signal and a fourth gate means, said second path including a delay element for introducing a second predetermined period of delay in said second replica relative to said input signal and fifth gate means, said second predetermined delay being greater than said first predetermined delay; said fourth gate means and said first gate means being operated for the same period of time to permit the application of said first replica to the input of said amplifying means to set the gain of said amplifying means in accordance with the relative magnitudes of said first replica and said reference signal; said second gate means and said fifth gate means being operated for substantially the same period of time to permit said second replica to be amplified by said amplifying means in accordance with the gain of said amplifying means previously set during the application of said first replica, and passed on to said apparatus.

8. The amplitude normalizer of claim 1, wherein said amplifying means includes variable resistance means, the magnitude of resistance of which is dependent upon the magnitude of said gain control signal, the gain of said amplifying means being dependent upon the magnitude of the resistance of said variable resistance means.

9. The amplitude normalizer of claim 8, wherein said variable resistance means is a field effect transistor having a gate upon which said gain control signal is impressed.

10. The amplitude normalizer of claim 9, wherein the resistance of said field effect transistor increases to decrease the gain of said amplifying means in response to increasing reverse bias voltage on the gate thereof, and said gain control signal decreases as said output signal of said amplifying means approaches the magnitude of said reference signal.

References Cited

UNITED STATES PATENTS 2,364,755 12/1944 Ritzmann -------- 330—141 X

ROY LAKE, Primary Examiner

J. B. MULLINS, Assistant Examiner

U.S. Cl. X.R.

330—51, 139, 141